(12) United States Patent
Wang et al.

(10) Patent No.: US 11,830,986 B2
(45) Date of Patent: Nov. 28, 2023

(54) CORE-SHELL PARTICLE ENERGIZING METHOD, ELECTRICITY STORAGE LAYER MANUFACTURING METHOD, QUANTUM BATTERY AND MANUFACTURING METHOD THEREOF

(71) Applicant: Institute of Nuclear Energy Research, Atomic Energy Council, Executive Yuan, R.O.C., Taoyuan (TW)

(72) Inventors: Min-Chuan Wang, Taoyuan (TW); Bo-Hsien Wu, Taoyuan (TW); Shang-En Liu, Taoyuan (TW)

(73) Assignee: INSTITUTE OF NUCLEAR ENERGY RESEARCH, ATOMIC ENERGY COUNCIL, EXECUTIVE YUAN, R.O.C., Taoyuan (TW)

( * ) Notice: Subject to any disclaimer, the term of this patent is extended or adjusted under 35 U.S.C. 154(b) by 345 days.

(21) Appl. No.: 17/010,816

(22) Filed: Sep. 2, 2020

(65) Prior Publication Data

US 2021/0408611 A1 Dec. 30, 2021

(30) Foreign Application Priority Data

Jun. 30, 2020 (TW) ................. 109122115

(51) Int. Cl.
*H01M 10/38* (2006.01)
*H01L 23/58* (2006.01)
(Continued)

(52) U.S. Cl.
CPC ............ *H01M 10/38* (2013.01); *H01L 23/58* (2013.01); *H01M 50/20* (2021.01); *H01M 50/502* (2021.01); *H10N 99/05* (2023.02)

(58) Field of Classification Search
CPC .......... H01L 21/02601; H01L 21/6835; H01L 21/0231; H01M 50/20; H01M 50/502; H10N 99/05
See application file for complete search history.

(56) References Cited

U.S. PATENT DOCUMENTS 5,650,130 A * 7/1997 Katz ................. B01J 37/349
264/122
10,373,825 B1 * 8/2019 Park .................... H01L 21/0242
(Continued)

OTHER PUBLICATIONS

RSC Adv., 2017, 7, 21758 (Year: 2017).*
Applied Surface Science 509 (2020) 145377 (Year: 2020).*
J Mater Sci: Mater Electron (2015) 26:3008-3019 (Year: 2015).*

*Primary Examiner* — Jarrett J Stark
(74) *Attorney, Agent, or Firm* — Cheng-Ju Chiang

(57) ABSTRACT

A quantum battery manufacturing method includes: providing a p-type semiconductor substrate including a first conductive substrate and a p-type semiconductor layer disposed on one surface of the first conductive substrate; providing an n-type semiconductor substrate including a second conductive substrate and an n-type semiconductor layer disposed on one surface of the second conductive substrate; and forming an electricity storage layer between the p-type semiconductor substrate and the n-type semiconductor substrate, and attaching two sides of the electricity storage layer respectively to the p-type semiconductor layer and the n-type semiconductor layer to form a quantum battery. The electricity storage layer is formed by heating a thermoplastic polymer to soften and become a liquid, mixing the liquid with energized core-shell particles, and coating a substrate with the mixture. Core-shell particles are disposed on a conductive substrate and irradiated with ultraviolet rays for energization.

4 Claims, 13 Drawing Sheets

(51) Int. Cl.
*H01M 50/20* (2021.01)
*H01M 50/502* (2021.01)
*H10N 99/00* (2023.01)

(56) References Cited

U.S. PATENT DOCUMENTS

| | | | | |
|---|---|---|---|---|
| 2006/0167138 | A1* | 7/2006 | Ishii | C09C 1/043 |
| | | | | 428/404 |
| 2013/0012634 | A1* | 1/2013 | Gauthy | C08K 9/02 |
| | | | | 524/413 |
| 2013/0202866 | A1* | 8/2013 | Lee | C23C 16/44 |
| | | | | 427/535 |
| 2016/0231585 | A1* | 8/2016 | Bauco | G02B 6/001 |
| 2018/0243727 | A1* | 8/2018 | Khan | B01J 35/004 |
| 2019/0067639 | A1* | 2/2019 | Jiang | H01L 51/5256 |
| 2019/0381490 | A1* | 12/2019 | Wang | B01J 27/125 |
| 2021/0246320 | A1* | 8/2021 | Coogan | C09D 101/284 |
| 2022/0179237 | A1* | 6/2022 | von Blanckenhagen | |
| | | | | G02C 7/107 |
| 2022/0213381 | A1* | 7/2022 | Krasteva | G03B 21/204 |
| 2022/0235266 | A1* | 7/2022 | Krasteva | C09K 11/883 |

* cited by examiner

CORE-SHELL PARTICLE ENERGIZING METHOD, ELECTRICITY STORAGE LAYER MANUFACTURING METHOD, QUANTUM BATTERY AND MANUFACTURING METHOD THEREOF

BACKGROUND

Technical Field

The present invention relates to a core-shell particle energizing method, an electricity storage layer manufacturing method, a quantum battery manufacturing method, and a quantum battery.

Related Art

With the rapid development of electronics industry, portable digital products such as notebooks, smart phones, and personal digital assistants (PDA) are increasing. Requirements of consumers for secondary batteries that are smaller and lighter, and therefore have higher energy density are also increasing.

Lithium ion batteries are one of common secondary batteries on the market. However, there are still problems to be resolved, including scarce reserves of rare elements, fluid leakage, explosion, and the like. For example, the commonly used cathode material of lithium ion batteries at present is $LiCoO_2$, where cobalt has a scarce reserve and is a strategic material. Consequently, it is costly and hard to access because of proneness to regulation. In addition, the cathode material $LiCoO_2$ is prone to disintegration when being subjected to long-term charging and discharging, and overcharging due to the effect from the layered structure of the material, which brings a lot of concern over safety. Moreover, the lithium ion batteries use a liquid electrolyte, and consequently have the fluid leakage problem and a limitation on the packaging size. When a battery charges and discharges, an electrochemical reaction occurs between an organic solvent and electrode materials, increasing an invalid interfacial layer on a surface of a solid electrolyte.

In contrast, the new quantum batteries have attracted attention for at least the following advantages: (1) being of an all-solid structure, and therefore being free of fluid leakage; (2) using low flammable materials, and therefore being less likely to overheat and catch fire; (3) using neither rare metal materials nor rare earth materials, and therefore avoiding shortage of resources; (4) using no materials with high environmental load, which is beneficial to environmental protection; (5) having a long charging and discharging life as being proved to be able to be charged and discharged more than 10,000 times (through an accelerated test); and (6) matching between the output power density and a capacitor battery in theoretical calculation.

The known manufacturing method of an electricity storage layer of the quantum battery includes: first forming an n-type metallic oxide semiconductor, $TiO_2$, as a seed layer on a polyimide substrate or an ITO substrate; then mixing a solvent with fatty acid titanium and silicone oil and stirring the mixture to form a spin coating material; then spin-coating the $TiO_2$ layer with the spin coating material; and drying and sintering. In this way, the fatty acid salt decomposes and forms a $TiO_2$ micro-particle layer covered by a silicone insulating film. In other words, $TiO_2$ micro-particles in the micro-particle layer covered by the silicone insulating film are formed at the same time of film forming. Problems exist when the quantum batteries are manufactured by using the above coating and thermal decomposition (or referred to as pyrolysis). For example, if a sintering temperature exceeds 300° C., sheet resistance of the bottom ITO electrode will increase. In addition, if the insulating film cannot fully cover $TiO_2$, $TiO_2$ will be in direct contact with PN junctions to cause current leakage, making it difficult to further control a required thickness of the whole battery.

SUMMARY

An objective of the present invention is to provide a core-shell particle energizing method capable of improving energizing effects of core-shell particles.

Another objective of the present invention is to provide an electricity storage layer manufacturing method capable of being carried out at a relatively low temperature and manufacturing an electricity storage layer of a relatively large thickness.

Another objective of the present invention is to provide a quantum battery manufacturing method capable of being carried out at a relatively low temperature and manufacturing a quantum battery of a relatively large thickness.

Another objective of the present invention is to provide a quantum battery that is safe, economic, environment-friendly, and durable.

The core-shell particle energizing method of the present invention includes: (A1000) providing a plurality of core-shell particles, each of the core-shell particles including a semiconductor metallic oxide particle and an insulating oxide layer enclosing the semiconductor metallic oxide particle, an energy gap of the insulating oxide layer being larger than that of the semiconductor metallic oxide particle; (A2000) deposing the core-shell particles on a conductive substrate; and (A3000) irradiating the core-shell particles on the conductive substrate with ultraviolet rays to form a plurality of energized core-shell particles.

In an embodiment of the present invention, the semiconductor metallic oxide particle includes an n-type semiconductor metallic oxide particle.

In an embodiment of the present invention, the semiconductor metallic oxide particle includes an n-type semiconductor $TiO_2$ particle.

In an embodiment of the present invention, the insulating oxide layer contains $SiO_2$.

The electricity storage layer manufacturing method of the present invention includes: (B1000) providing a plurality of energized core-shell particles; (B2000) heating a thermoplastic polymer to soften and become a liquid; (B3000) mixing the energized core-shell particles with the liquid thermoplastic polymer to form an electricity storage layer precursor; and (B4000) coating a substrate with the electricity storage layer precursor to form an electricity storage layer.

In an embodiment of the present invention, the energized core-shell particles are formed by using the core-shell particle energizing method described above.

In an embodiment of the present invention, the thermoplastic polymer has a melting point lower than 300° C.

The quantum battery manufacturing method of the present invention includes: (C1000) providing a p-type semiconductor substrate including a first conductive substrate and a p-type semiconductor layer disposed on one surface of the first conductive substrate; (C2000) providing an n-type semiconductor substrate including a second conductive substrate and an n-type semiconductor layer disposed on one surface of the second conductive substrate; and (C3000) forming an electricity storage layer between the p-type semiconductor substrate and the n-type semiconductor substrate by using the electricity storage layer manufacturing method described above, and attaching two sides of the electricity storage layer respectively to the p-type semiconductor layer and the n-type semiconductor layer to form a quantum battery.

In an embodiment of the present invention, step C3000 includes: (C3110) forming an electricity storage layer on another surface of the p-type semiconductor layer opposite to the first conductive substrate by using the electricity storage layer manufacturing method according to any one of claims 5 to 7; (C3210) forming another electricity storage layer on another surface of the n-type semiconductor layer opposite to the second conductive substrate by using the electricity storage layer manufacturing method according to any one of claims 5 to 7; and (C3310) attaching the electricity storage layers on the p-type semiconductor layer and the n-type semiconductor layer to each other.

In an embodiment of the present invention, each of the electricity storage layers has a thickness of 1-200 μm.

In an embodiment of the present invention, step C3000 includes: (C3120) forming an electricity storage layer on one of another surface of the p-type semiconductor layer opposite to the first conductive substrate and another surface of the n-type semiconductor layer opposite to the second conductive substrate by using the electricity storage layer manufacturing method described above; and (C3320) attaching the electricity storage layer to the other of the another surface of the p-type semiconductor layer opposite to the first conductive substrate and the another surface of the n-type semiconductor layer opposite to the second conductive substrate in step C3120 on which the electricity storage layer is disposed.

In an embodiment of the present invention, the p-type semiconductor layer is made of NiO.

In an embodiment of the present invention, the n-type semiconductor layer is made of $WO_3$.

The quantum battery of the present invention includes the p-type semiconductor substrate, the n-type semiconductor substrate, and the electricity storage layer. The p-type semiconductor substrate includes the first conductive substrate and the p-type semiconductor layer disposed on one surface of the first conductive substrate. The n-type semiconductor substrate includes the second conductive substrate and the n-type semiconductor layer disposed on one surface of the second conductive substrate. The electricity storage layer is disposed between the p-type semiconductor substrate and the n-type semiconductor substrate, two sides of the electricity storage layer are respectively attached to the p-type semiconductor layer and the n-type semiconductor layer, and the electricity storage layer includes a thermoplastic polymer and a plurality of energized core-shell particles mixed in the thermoplastic polymer.

In an embodiment of the present invention, the p-type semiconductor layer is made of NiO.

In an embodiment of the present invention, the n-type semiconductor layer is made of $WO_3$.

In an embodiment of the present invention, the electricity storage layer is formed by using the electricity storage layer manufacturing method described above.

In an embodiment of the present invention, the energized core-shell particles are formed by using the core-shell particle energizing method described above.

In an embodiment of the present invention, the electricity storage layer has a thickness of 1-400 μm.

DETAILED DESCRIPTION

Figure 1:
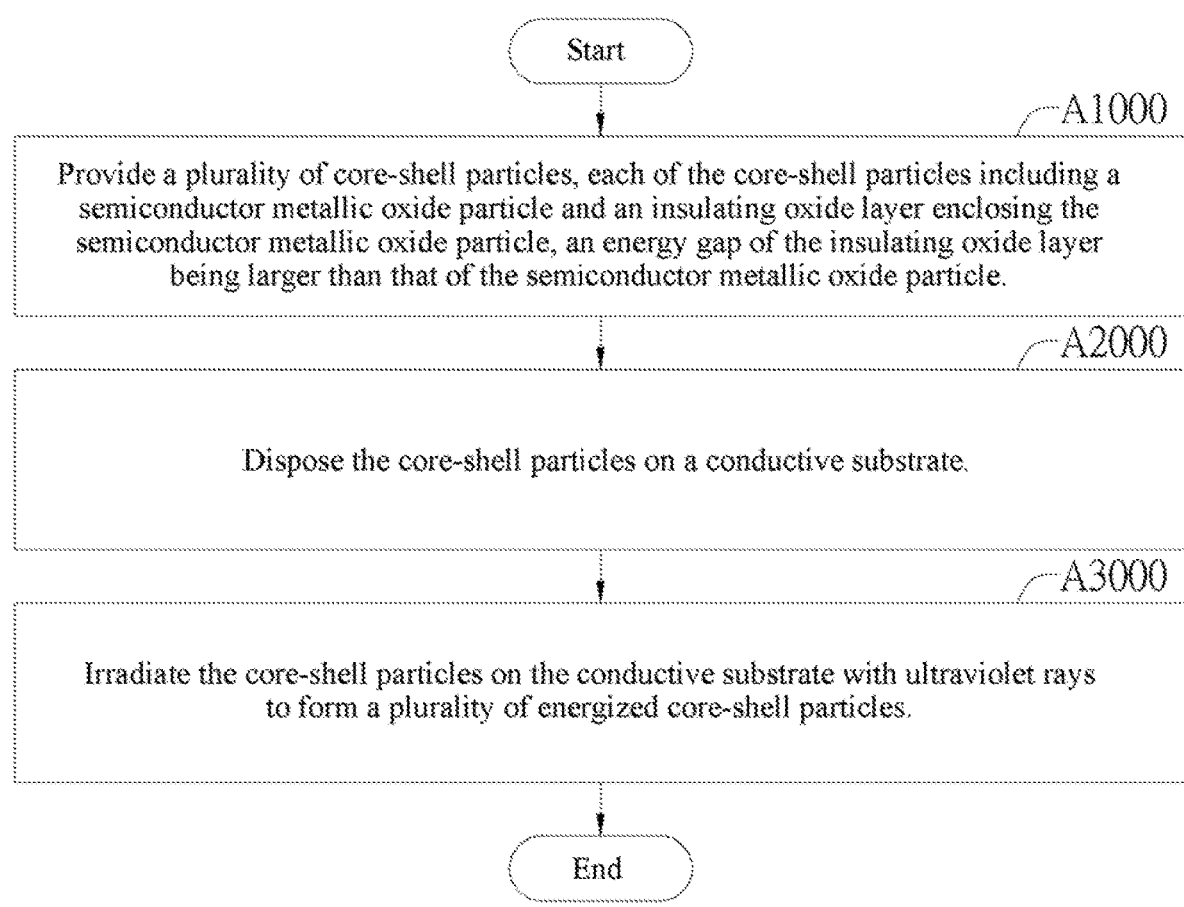
FIG. 1 is a schematic flowchart of an embodiment of a core-shell particle energizing method of the present invention.

As shown in FIG. 1, a schematic flowchart of an embodiment, a core-shell particle energizing method of the present invention includes, for example, the following steps.

Step A1000. Provide a plurality of core-shell particles. Each of the core-shell particles includes a semiconductor metallic oxide particle and an insulating oxide layer enclosing the semiconductor metallic oxide particle. An energy gap of the insulating oxide layer is larger than that of the semiconductor metallic oxide particle. More specifically, the core-shell particles with a particle size of 1-100 nm, preferably 1-20 nm are manufactured by using, for example, a hydrophobic chemical vapor deposition method. As the "core", the semiconductor metallic oxide particle includes an n-type semiconductor metallic oxide particle, preferably an n-type semiconductor $TiO_2$ particle. As the "shell", the insulating oxide layer contains $SiO_2$. The amorphous $SiO_2$ has an energy gap of 9.0 eV bigger than an energy gap of $TiO_2$ of about 2.98 eV-3.26 eV.

Step A2000. Dispose the core-shell particles disposed on a conductive substrate. More specifically, the core-shell particles are disposed on a conductive substrate made of, for example, aluminum, copper, or stainless steel, and the conductive substrate is grounded.

Step A3000. Irradiate the core-shell particles on the conductive substrate with ultraviolet rays to form a plurality of energized core-shell particles. More specifically, the core-shell particles are disposed on the conductive substrate, and the semiconductor material is irradiated with ultraviolet rays. An electron of an electron-hole pair generated due to the photoelectric effect provides a sufficient electric field due to the built-in potential effect, transcends the high potential barrier of the insulating oxide layer, the shell of the core-shell particles, by using the tunneling effect, and then flows out of the conductive substrate to be grounded. Moreover, a new transient energy level is formed in the core-shell particles to provide an energizing function, so as to form an energizable state. The semiconductor material can be Si, Ge, SiC, or the like from Group IV of the periodic table, or a metallic oxide semiconductor material such as $TiO_2$, $WO_3$, or NiO.

Figure 2:
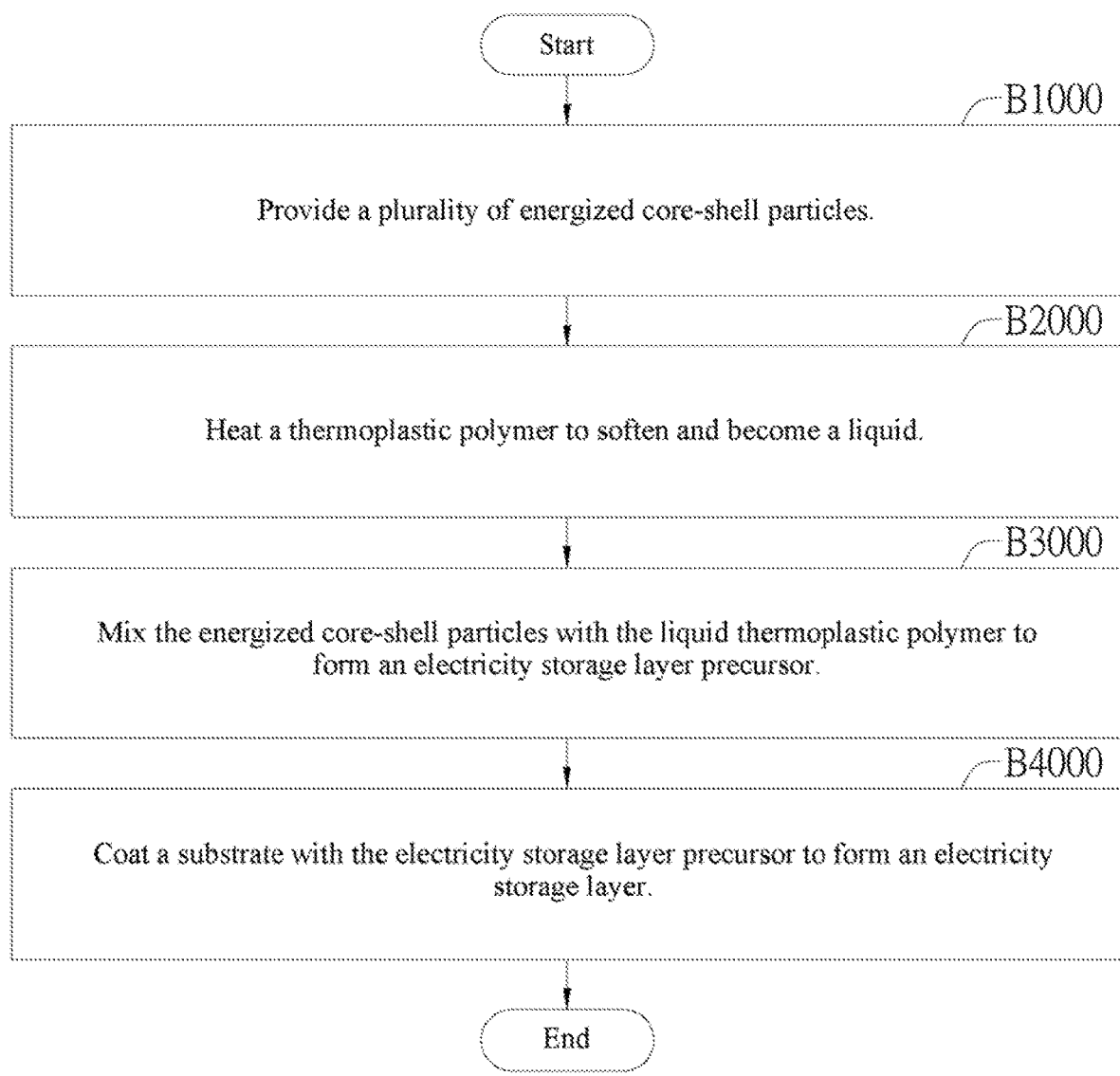
FIG. 2 is a schematic flowchart of an embodiment of an electricity storage layer manufacturing method of the present invention.

As shown in FIG. 2, a schematic flowchart of an embodiment, an electricity storage layer manufacturing method of the present invention includes, for example, the following steps.

Step B1000. Provide a plurality of energized core-shell particles. More specifically, energized core-shell particles are formed through steps A1000 to A3000 by using the core-shell particle energizing method described above.

Step B2000. Heat a thermoplastic polymer to soften and become a liquid. More specifically, the thermoplastic polymer such as ethylene-vinyl acetate copolymer (EVA), polyvinyl butyral (PVB), polyacrylonitrile (PAN), polymethyl methacrylate (PMMA), or polyvinyl acetate (PVA or PVAc) is heated to 120° C. and transformed into a liquid. In a different embodiment, the thermoplastic polymer has a melting point lower than 300° C.

Step B3000. Mix the energized core-shell particles with the liquid thermoplastic polymer to form an electricity storage layer precursor. More specifically, the energized core-shell particles in step B1000 are mixed with the liquid thermoplastic polymer in step B2000 to form a precursor of an electricity storage layer before film forming.

Step B4000. Coat a substrate with the electricity storage layer precursor to form an electricity storage layer. More specifically, the substrate is coated, in such a manner as spin coating, with the electricity storage layer precursor formed in step B3000 to form an electricity storage layer.

Based on the above, the highest temperature in the manufacturing process only needs to heat the thermoplastic polymer to soften and become a liquid, and the energized core-shell particles are mixed with the thermoplastic polymer. A problem of whether a silicone insulating film can fully cover the $TiO_2$ particles does not need to be taken into consideration when the thickness of the electricity storage layer is to be determined. Therefore, compared with the conventional coating and thermal decomposition method, the electricity storage layer manufacturing method of the present invention can be carried out at a relatively low temperature and manufacture the electricity storage layer of a relatively large thickness.

Figure 3:
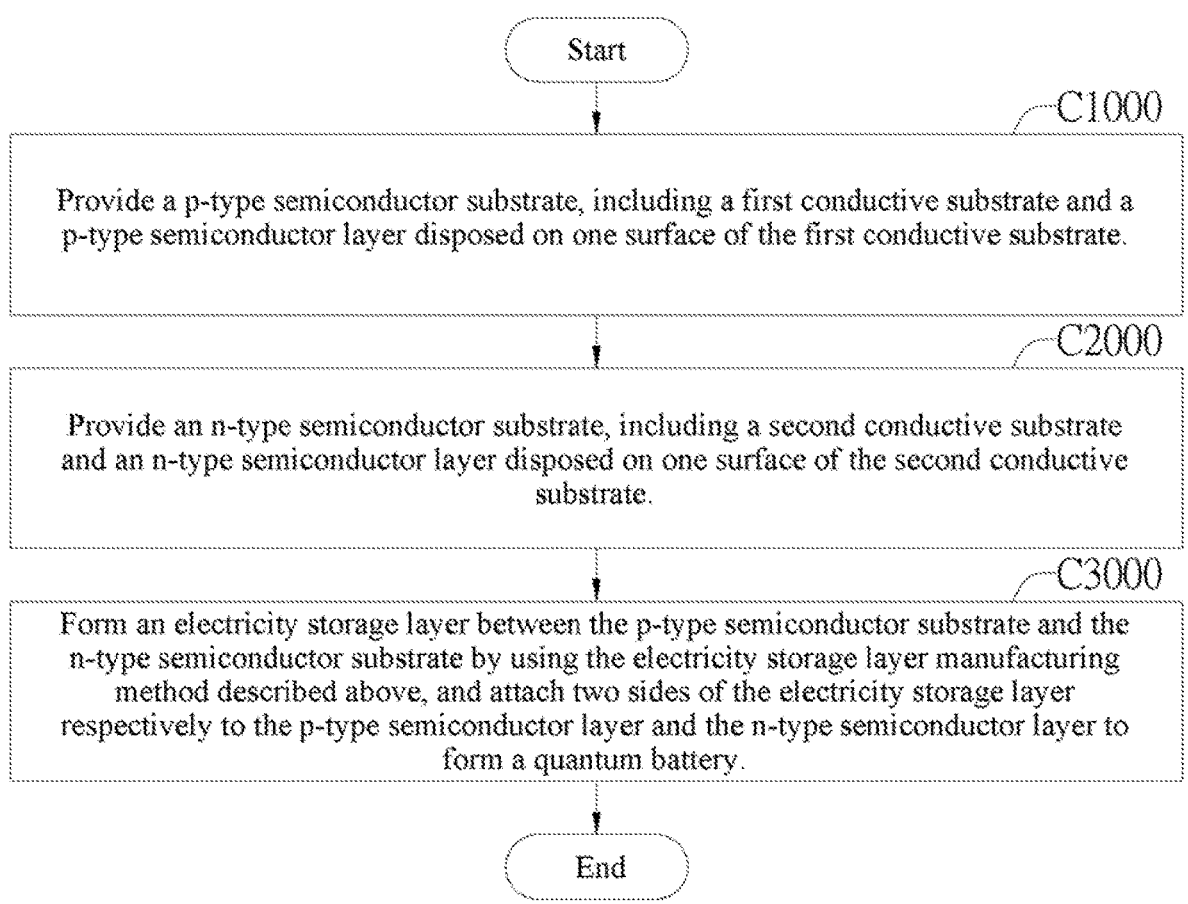
FIG. 3 is a schematic flowchart of an embodiment of a quantum battery manufacturing method of the present invention.

As shown in FIG. 3, a schematic flowchart of an embodiment, a quantum battery manufacturing method of the present invention includes the following steps.

Step C1000. Provide a p-type semiconductor substrate, including a first conductive substrate and a p-type semiconductor layer disposed on one surface of the first conductive substrate. More specifically, the p-type semiconductor layer is made of NiO. In an embodiment, the p-type semiconductor layer made of NiO is deposited, by using the plasma coating technology, on a conductive substrate made of, for example, aluminum, copper, or stainless steel.

Step C2000. Provide an n-type semiconductor substrate, including a second conductive substrate and an n-type semiconductor layer disposed on one surface of the second conductive substrate. More specifically, the n-type semiconductor layer is made of $WO_3$. In an embodiment, the n-type semiconductor layer made of $WO_3$ is deposited, by using the plasma coating technology, on a conductive substrate made of, for example, aluminum, copper, or stainless steel.

Step C3000. Form an electricity storage layer between the p-type semiconductor substrate and the n-type semiconductor substrate by using the electricity storage layer manufacturing method described above, and attach two sides of the electricity storage layer respectively to the p-type semiconductor layer and the n-type semiconductor layer to form a quantum battery.

Based on the above, the highest temperature in the manufacturing process only needs to heat a thermoplastic polymer to soften and become a liquid because the electricity storage layer is formed by using the electricity storage layer manufacturing method of the present invention described above, and energized core-shell particles are mixed with the thermoplastic polymer. A problem of whether a silicone insulating film can fully cover the $TiO_2$ particles does not need to be taken into consideration when the thickness of the electricity storage layer is to be determined. Therefore, compared with the conventional coating and thermal decomposition method, the quantum battery manufacturing method of the present invention can be carried out at a relatively low temperature and manufacture the quantum battery with an electricity storage layer of a relatively large thickness.

Figure 4A:
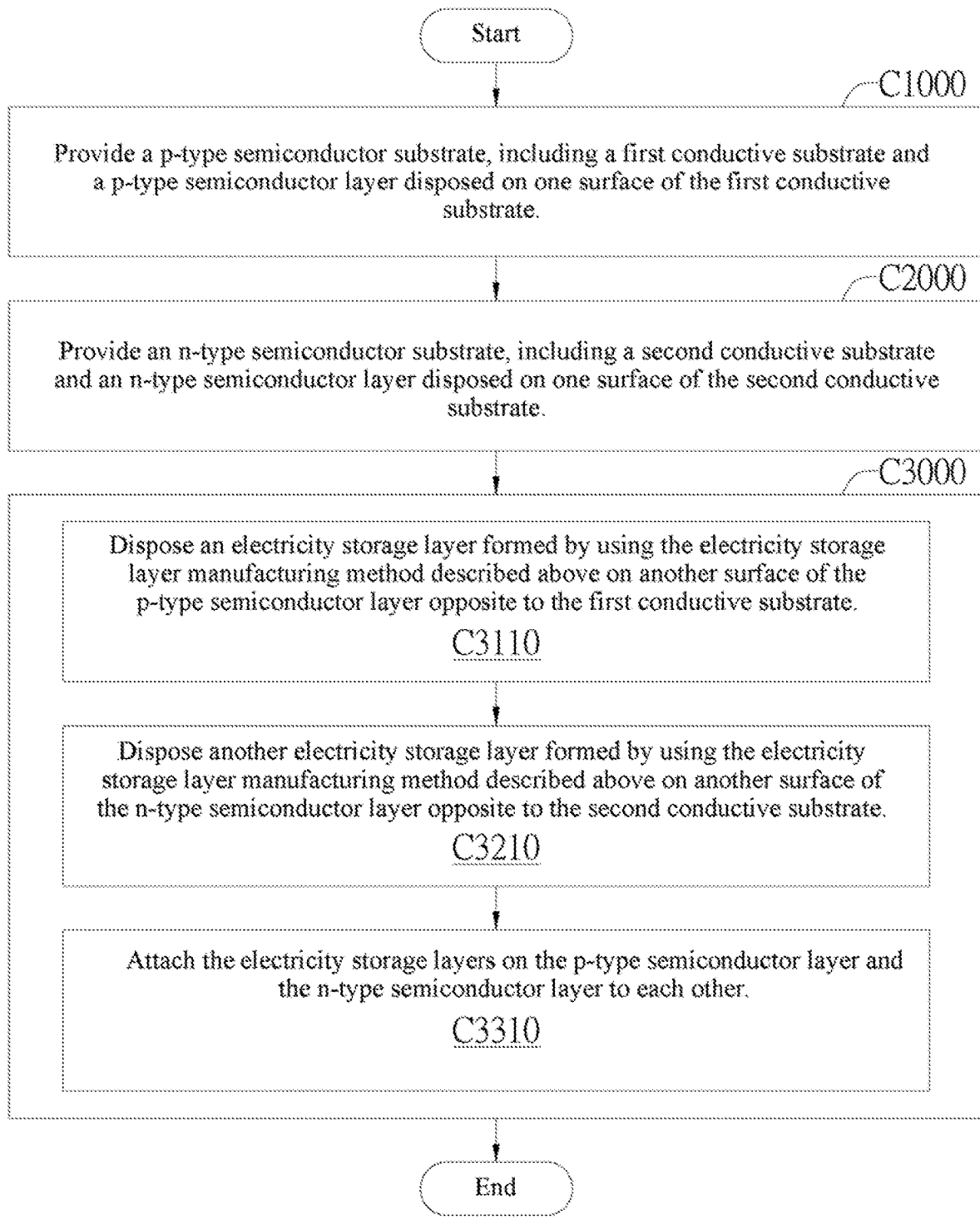
FIG. 4A is a schematic flowchart of a different embodiment of a quantum battery manufacturing method of the present invention.
Figure 4B:
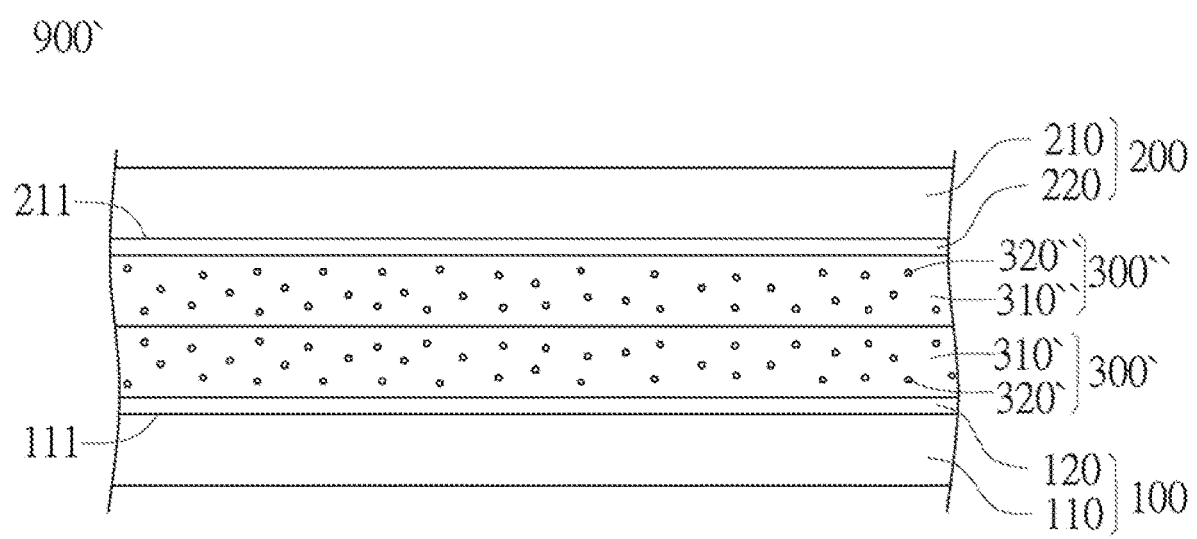
FIG. 4B is a schematic diagram of an embodiment of a quantum battery of the present invention.

How the electricity storage layer is formed between the p-type semiconductor substrate and the n-type semiconductor substrate can vary with requirements of design, manufacturing, and usage. As shown in FIGS. 4A and 4B, a schematic flowchart of an embodiment, step C3000 includes: (C3110) forming an electricity storage layer on another surface of the p-type semiconductor layer opposite to the first conductive substrate by using the electricity storage layer manufacturing method according to any one of claims 5 to 7; (C3210) forming another electricity storage layer on another surface of the n-type semiconductor layer opposite to the second conductive substrate by using the electricity storage layer manufacturing method according to any one of claims 5 to 7; and (C3310) attaching the electricity storage layers on the p-type semiconductor layer and the n-type semiconductor layer to each other. In other words, in this embodiment, the electricity storage layers are respectively formed on another surface of the p-type semiconductor layer opposite to the first conductive substrate and another surface of the n-type semiconductor layer opposite to the second conductive substrate. The electricity storage layer has a thickness of 1-200 µm. After being attached to each other, the two electricity storage layers are considered as a single electricity storage layer, with a thickness of 2-400 µm.

Further, a quantum battery 900' of the present invention as shown in FIG. 4B can be formed through the embodiment as shown in FIG. 4A, and includes a p-type semiconductor substrate 100, an n-type semiconductor substrate 200, and an electricity storage layer 300. The p-type semiconductor substrate 100 includes a first conductive substrate 110 and a p-type semiconductor layer 120 disposed on one surface 111 of the first conductive substrate 110. The n-type semiconductor substrate 200 includes a second conductive substrate 210 and an n-type semiconductor layer 220 disposed on one surface 211 of the second conductive substrate 210. The electricity storage layer 300 is disposed between the p-type semiconductor substrate 100 and the n-type semiconductor substrate 200, and includes an electricity storage layer 300' attached to the p-type semiconductor layer 120, and an electricity storage layer 300" attached to the n-type semiconductor layer 220. The electricity storage layer 300' and the electricity storage layer 300" are attached to each other. The electricity storage layers 300' and 300" respectively include thermoplastic polymers 310' and 310", and a plurality of energized core-shell particles 320' and 320" mixed in the thermoplastic polymers. The electricity storage layer 300 has a thickness of 2-400 µm.

Figure 5A:
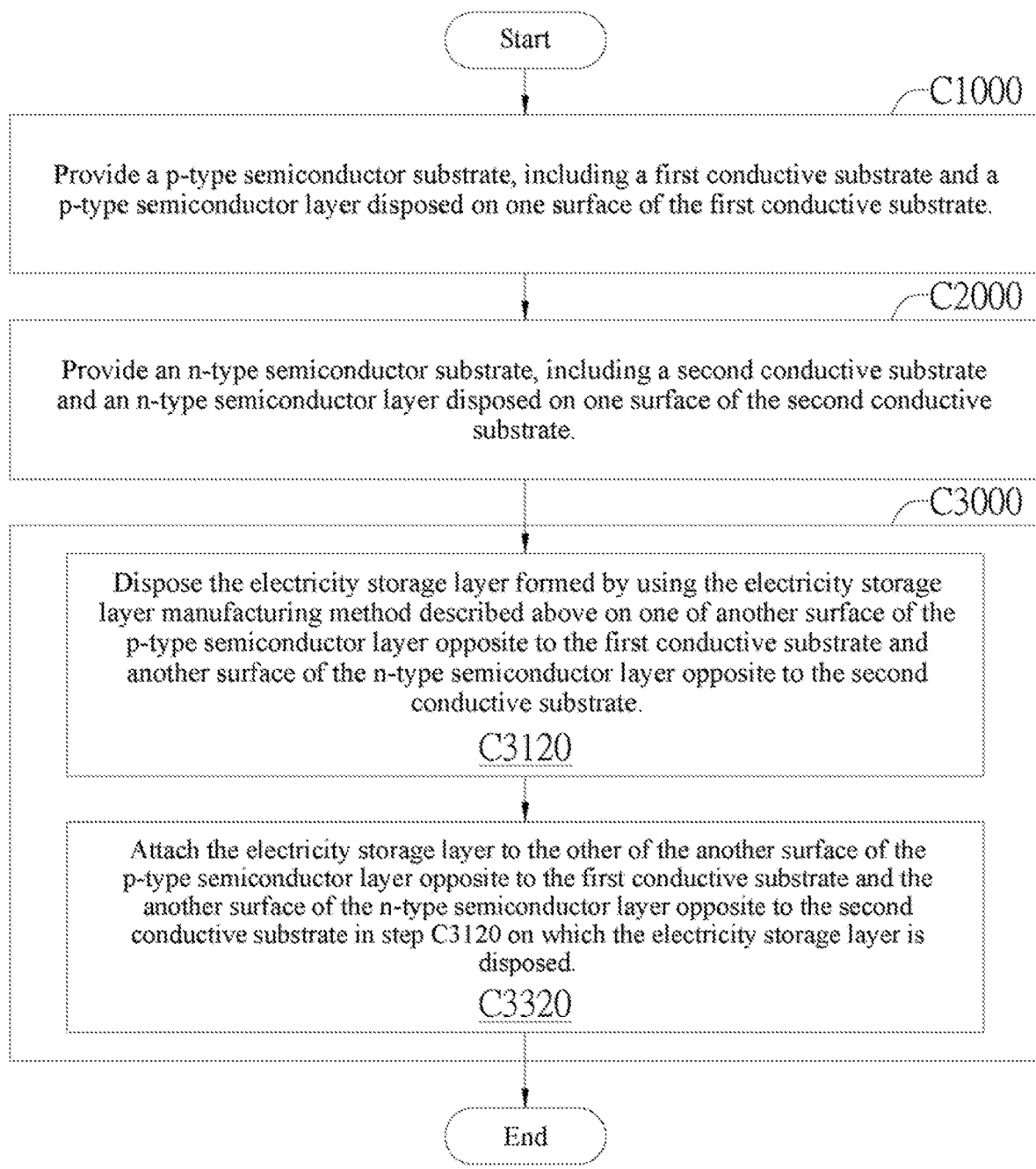
FIG. 5A is a schematic flowchart of a different embodiment of a quantum battery manufacturing method of the present invention.

In another aspect, as shown in FIG. 5A, a schematic flowchart of an embodiment, step C3000 includes: (C3120) forming an electricity storage layer on one of another surface of the p-type semiconductor layer opposite to the first conductive substrate and another surface of the n-type semiconductor layer opposite to the second conductive substrate by using the electricity storage layer manufacturing method described above; and (C3320) attaching the electricity storage layer to the other of the another surface of the p-type semiconductor layer opposite to the first conductive substrate and the another surface of the n-type semiconductor layer opposite to the second conductive substrate in step C3120 on which the electricity storage layer is disposed. In other words, in this embodiment, the electricity storage layer is formed on only one of another surface of the p-type semiconductor layer opposite to the first conductive substrate and another surface of the n-type semiconductor layer opposite to the second conductive substrate. The electricity storage layer has a thickness of 1-200 μm.

Figure 5B:
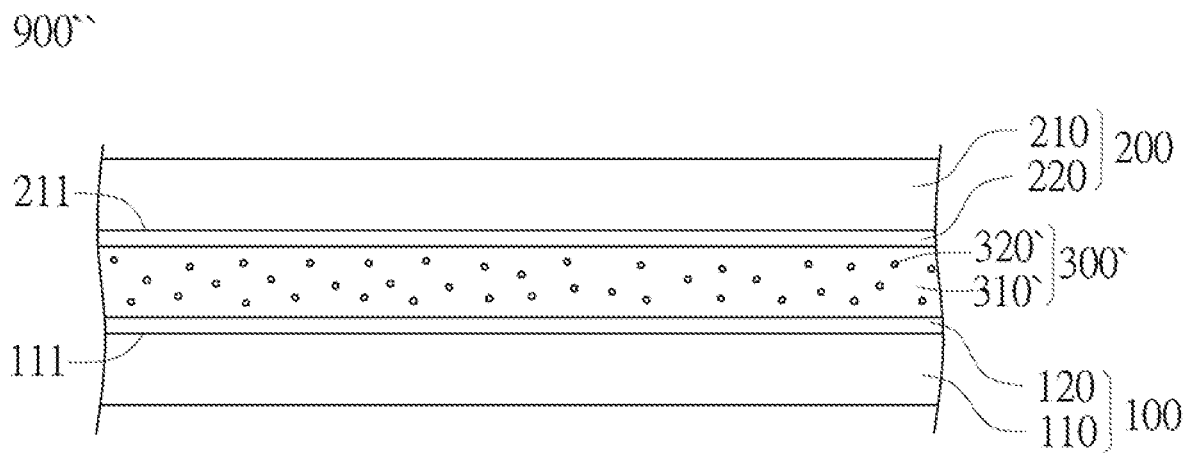
FIG. 5B is a schematic diagram of a different embodiment of a quantum battery of the present invention.
Figure 6A:
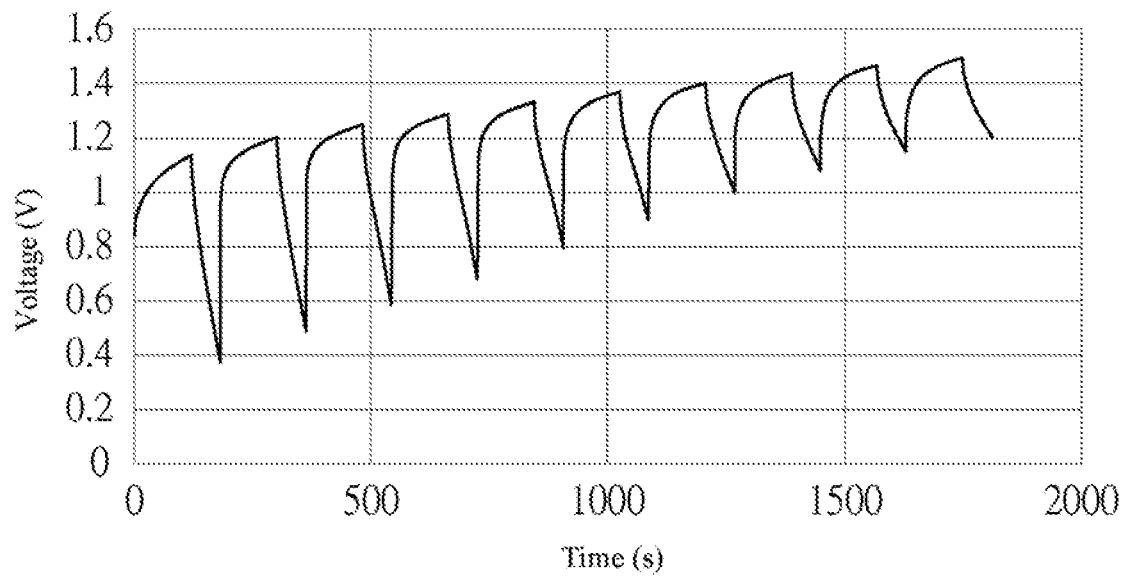
FIG. 6A to FIG. 7C are measurement results of a quantum battery of the present invention.
Figure 6B:
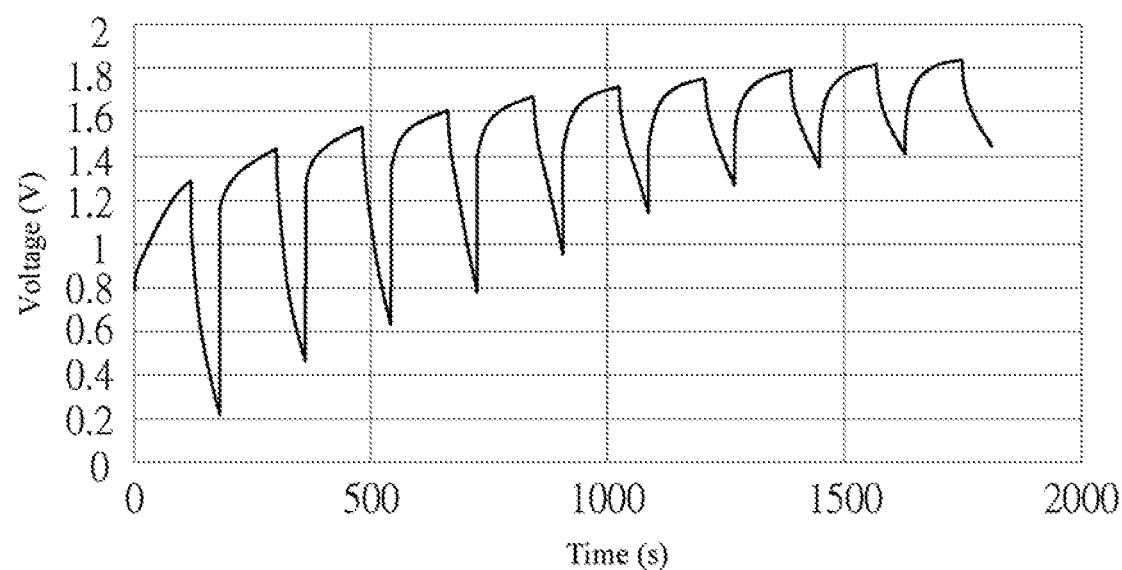
Figure 6C:
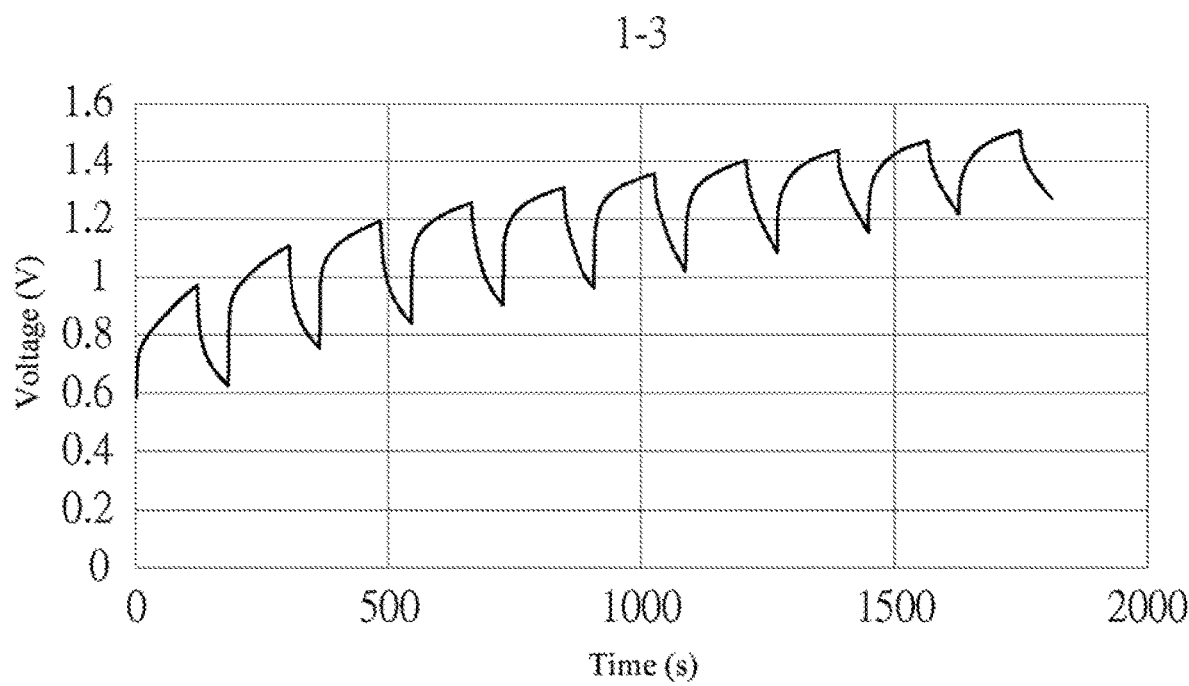
Figure 7A:
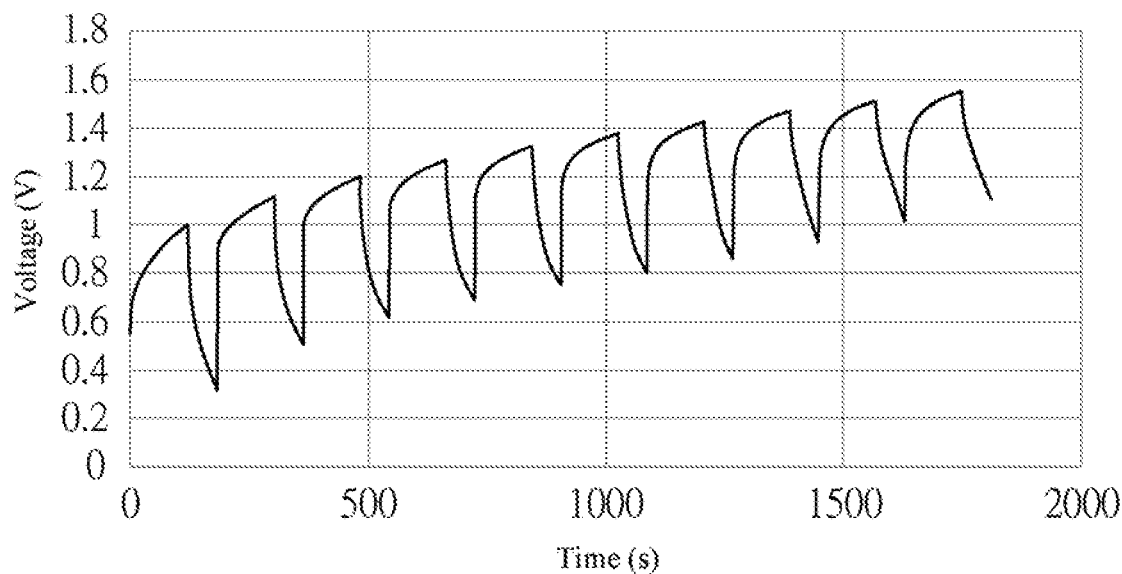
Figure 7B:
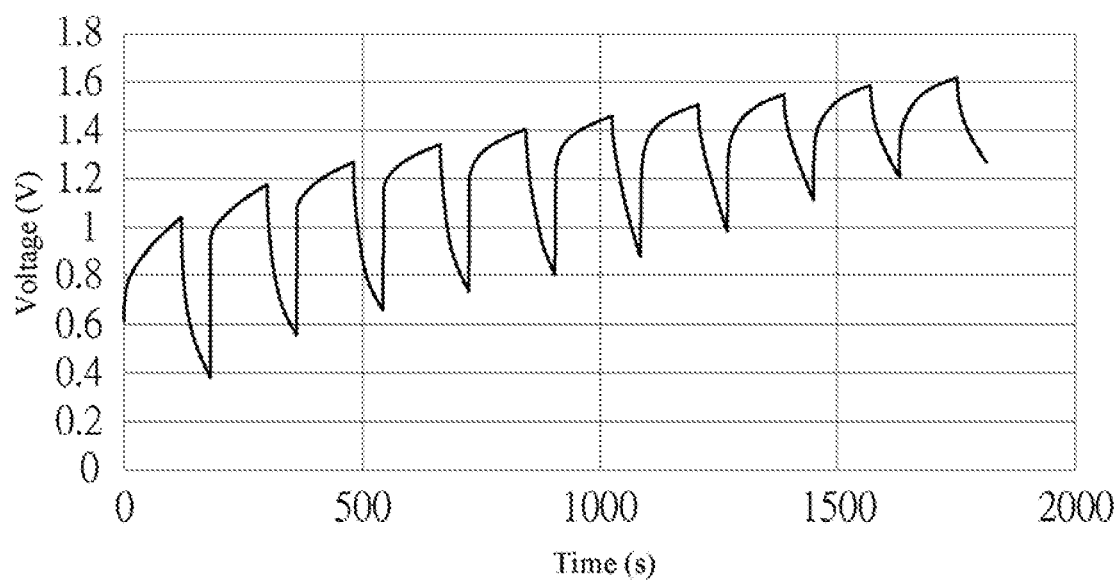
Figure 7C:
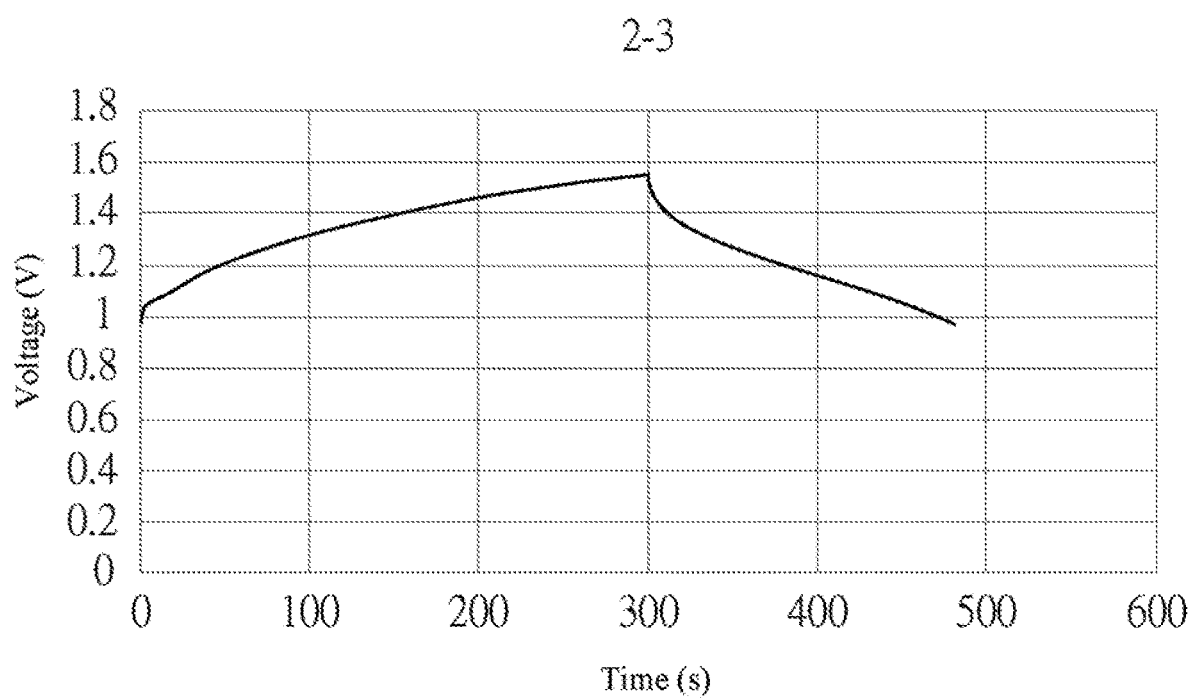

Further, a quantum battery 900" of the present invention as shown in FIG. 5B can be formed through the embodiment as shown in FIG. 5A, and includes a p-type semiconductor substrate 100, an n-type semiconductor substrate 200, and an electricity storage layer 300'. The p-type semiconductor substrate 100 includes a first conductive substrate 110 and a p-type semiconductor layer 120 disposed on one surface 111 of the first conductive substrate 110. The n-type semiconductor substrate 200 includes a second conductive substrate 210 and an n-type semiconductor layer 220 disposed on one surface 211 of the second conductive substrate 210. The electricity storage layer 300' is disposed between the p-type semiconductor substrate 100 and the n-type semiconductor substrate 200, and has the two sides respectively attached to the p-type semiconductor layer 120 and the n-type semiconductor layer 220. The electricity storage layers 300' includes a thermoplastic polymer 310' and a plurality of energized core-shell particles 320' mixed in the thermoplastic polymer 310', and has a thickness of 1-200 μm.

Measurement of the Quantum Battery

The quantum battery 900' of the embodiment as shown in FIG. 4B is measured. A first conductive substrate and a second conductive substrate are made of stainless steel, and NiO and $WO_3$ are respectively sputtered on them to serve as the cathode and the anode. Core-shell particles (with $TiO_2$ as the core and $SiO_2$ as the shell) are irradiated with ultraviolet rays, and then are mixed into a melted liquid polymer at a ratio of 0.5 wt %. Details are as shown in table 1 and table 2 below. Charging and discharging properties are then measured by a constant current (CC). The results are as shown in FIG. 6A to FIG. 7C. The quantum battery is proved to have the charging and discharging properties of an energizing battery (add the description of the measurement results).

TABLE 1

|  | 1-1 | 1-2 | 1-3 |
| --- | --- | --- | --- |
| Exposure time of core-shell particles | 1 hr | 1 hr | 1 hr |
| Area of sample to be tested | About 2 cm × 4 cm | About 2 cm × 4 cm | About 2 cm × 4 cm |
| Is NiO or $WO_3$ coated? | NiO | NiO | NiO and $WO_3$ |
| Film weight | 0.5839 g | 0.2938 g | 0.5903 g and 0.5904 g |
| Charging and discharging conditions | +being connected to NiO, and −being connected to $WO_3$ Being charged by 10 μA for 2 min Being discharged by −1 μA for 1 min 10 cycles | +being connected to NiO, and −being connected to $WO_3$ Being charged by 10 μA for 2 min Being discharged by −1 μA for 1 min 10 cycles | +being connected to NiO, and −being connected to $WO_3$ Being charged by 10 μA for 2 min Being discharged by −1 μA for 1 min 10 cycles |

TABLE 2

|  | 2-1 | 2-2 | 2-3 |
| --- | --- | --- | --- |
| Exposure time of core-shell particles | 6.5 hr | 6.5 hr | 6.5 hr |
| Area of sample to be tested | About 2 cm × 4 cm | About 2 cm × 4 cm | About 2 cm × 4 cm |
| Is NiO or $WO_3$ coated? | NiO | NiO | NiO |
| Film weight | 0.3006 g | 0.1522 g | 0.1522 g |
| Charging and discharging conditions | +being connected to NiO, and −being connected to $WO_3$ Being charged by 10 μA for 2 min Being discharged by −1 μA for 1 min 10 cycles | +being connected to NiO, and −being connected to $WO_3$ Being charged by 10 μA for 2 min Being discharged by −1 μA for 1 min 10 cycles | +being connected to NiO, and −being connected to $WO_3$ Being charged by 10 μA for 5 min Being discharged by −1 μA for 3 min 1 cycle |

Reproducibility Test

Figure 8A:
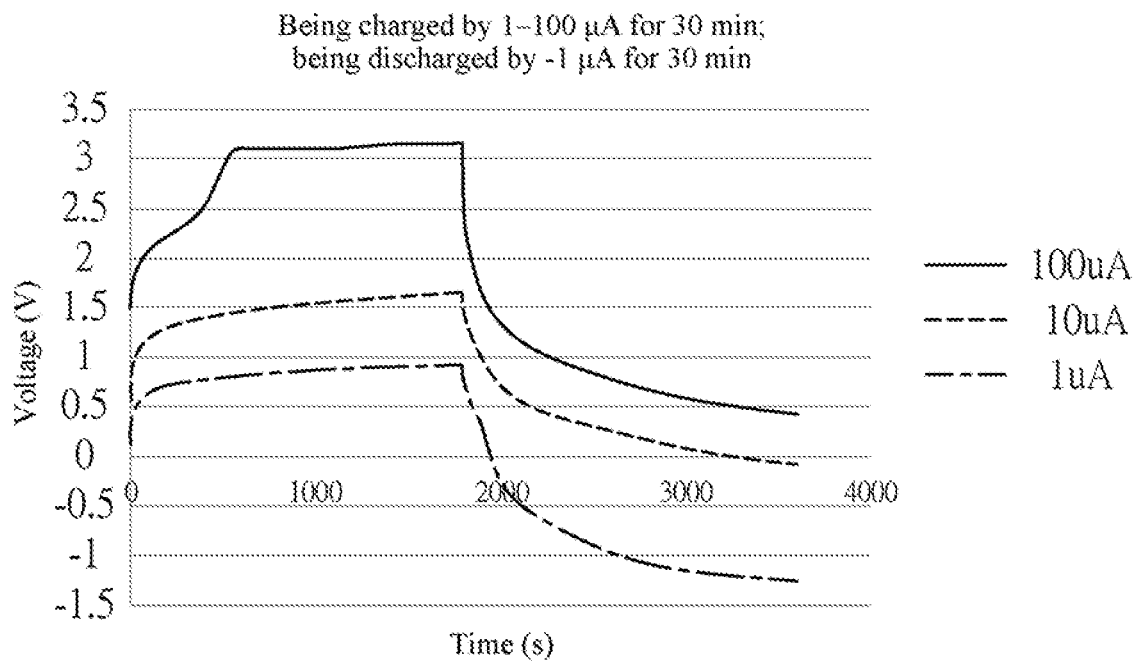
FIG. 8A to FIG. 8C are reproducibility test results of a quantum battery of the present invention.
Figure 8B:
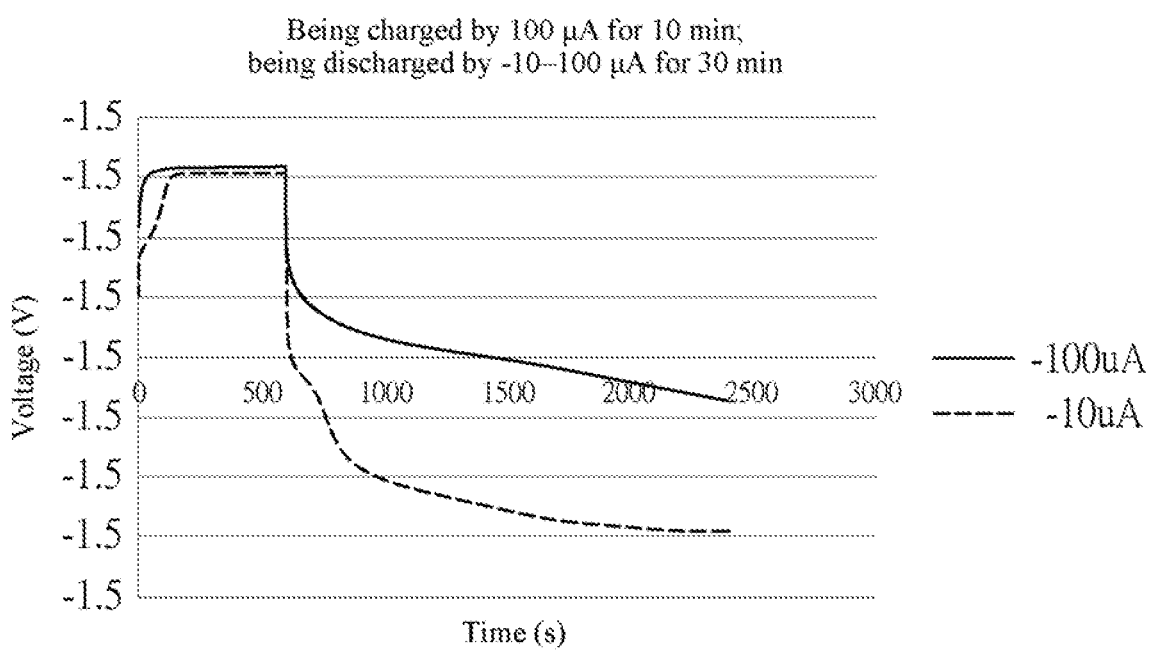
Figure 8C:
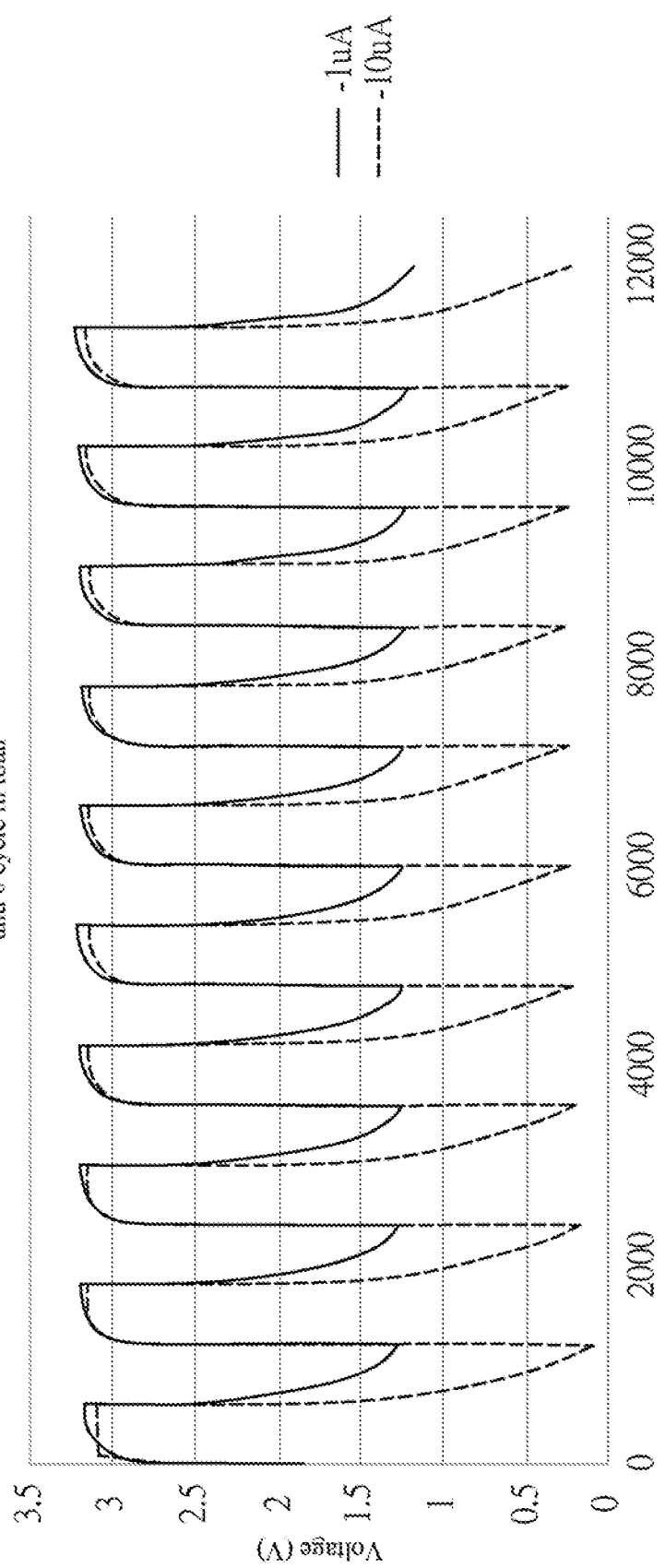

The quantum battery 900' of the embodiment as shown in FIG. 4B is measured. A first conductive substrate and a second conductive substrate are made of stainless steel, and NiO and $WO_3$ are respectively sputtered on them to serve as the cathode and the anode. Core-shell particles (with $TiO_2$ as the core and $SiO_2$ as the shell) are irradiated with ultraviolet rays for 1 h, and then are mixed into a melted liquid polymer, with which the cathode and the anode materials are coated. Tests of charging and discharging properties are then performed by a CC. The results are as shown in FIG. 8A to FIG. 8C. The quantum battery is proved to have the charging and discharging properties of an energizing battery.

Although the above description and figures have revealed the preferred embodiments of the present invention, it is necessary to understand that various additions, many modifications and substitutions can be used in the preferred embodiments of the present invention without departing from the spirit and scope of the principle of the present invention as defined in the claims attached. One of ordinary skill in the art of the present invention should understand that modifications of various forms, structures, arrangements, ratios, materials, elements and components can be made on the present invention. Therefore, the embodiments disclosed herein are used for illustrating the present invention rather than limiting the present invention. The scope of the present invention should be defined by the claims attached, covers legal equivalents thereof and is not limited to the foregoing description.

SYMBOL DESCRIPTION

100 P-type semiconductor substrate
110 First conductive substrate
111 Surface
120 P-type semiconductor layer
200 N-type semiconductor substrate
210 Second conductive substrate
211 Surface
220 N-type semiconductor layer
300 Electricity storage layer
300' Electricity storage layer
300" Electricity storage layer
310' Thermoplastic polymer
310" Thermoplastic polymer
320' Energized core-shell particle
320" Energized core-shell particle
900 Quantum battery
A1000 Step
A2000 Step
A3000 Step
B1000 Step
B2000 Step
B3000 Step
B4000 Step
C1000 Step
C2000 Step
C3000 Step
C3110 Step
C3120 Step
C3210 Step
C3310 Step
C3320 Step

What is claimed is:

1. A core-shell particle energizing method, comprising:
   (A1000) providing a plurality of core-shell particles, each of the core-shell particles comprising a semiconductor metallic oxide particle and an insulating oxide layer enclosing the semiconductor metallic oxide particle, an energy gap of the insulating oxide layer being larger than that of the semiconductor metallic oxide particle;
   (A2000) depositing the core-shell particles on a conductive substrate, wherein the conductive substrate is grounded; and
   (A3000) irradiating the core-shell particles on the conductive substrate with ultraviolet rays to form a plurality of energized core-shell particles.

2. The core-shell particle energizing method according to claim 1, wherein the semiconductor metallic oxide particle comprises an n-type semiconductor metallic oxide particle.

3. The core-shell particle energizing method according to claim 2, wherein the semiconductor metallic oxide particle comprises an n-type semiconductor $TiO_2$ particle.

4. The core-shell particle energizing method according to claim 1, wherein the insulating oxide layer contains $SiO_2$.

* * * * *